(12) United States Patent
Aaron et al.

(10) Patent No.: US 8,243,954 B2
(45) Date of Patent: Aug. 14, 2012

(54) SYSTEM AND METHOD FOR A DEVICE SOUND INTERFACE MANAGER

(75) Inventors: Andrew Aaron, Ardsley, NY (US); Dimitri Kanevsky, Ossining, NY (US); Edward E. Kelley, Wappingers Falls, NY (US); Bhuvana Ramabhadran, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 1239 days.

(21) Appl. No.: 12/019,153

(22) Filed: Jan. 24, 2008

(65) Prior Publication Data
US 2009/0190767 A1 Jul. 30, 2009

(51) Int. Cl.
H03G 3/20 (2006.01)
A61F 11/06 (2006.01)
H04B 1/00 (2006.01)
H04B 15/00 (2006.01)
G10K 11/16 (2006.01)

(52) U.S. Cl. ........... 381/94.1; 381/57; 381/86; 381/71.1
(58) Field of Classification Search ............... 381/94.1, 381/57, 72, 71.1, 13, 108, 96, 70, 86, 94.4
See application file for complete search history.

(56) References Cited

U.S. PATENT DOCUMENTS

| 7,561,030 B2* | 7/2009 | McBride et al. ......... 340/426.13 |
| 2002/0091337 A1 | 7/2002 | Adams et al. |
| 2005/0256594 A1 | 11/2005 | Wong et al. |
| 2007/0282912 A1* | 12/2007 | Reiner ........................ 707/104.1 |
| 2008/0069370 A1* | 3/2008 | Chang ............................. 381/86 |
| 2008/0267416 A1* | 10/2008 | Goldstein et al. ............... 381/56 |

FOREIGN PATENT DOCUMENTS
GB 2308932 A 9/1997

* cited by examiner

*Primary Examiner* — Chuong A. Luu
(74) *Attorney, Agent, or Firm* — Cantor Colburn LLP

(57) ABSTRACT

A system for regulating the volume and frequency content of audio producing devices, the system includes: one or more noise making objects (NMO) configured with individual sound control devices in electrical communication with a noise management server and one or more audio producing devices configured with individual sound control devices; wherein the sound control devices have electronic logic processing, storage, and communication capabilities; wherein the noise management server utilize the sound control devices to: determine whether the NMO are producing noise in the audible range of one or more audio producing devices; determine a noise characteristic of the one or more NMO; command the one or more NMO to send the noise characteristic to the one or more audio producing devices; and wherein the volume and frequency content of audio produced by the one or more audio producing devices is adjusted in response to the received noise characteristic.

18 Claims, 4 Drawing Sheets

SYSTEM AND METHOD FOR A DEVICE SOUND INTERFACE MANAGER

BACKGROUND OF THE INVENTION

1. Field of the Invention

This invention relates generally to noise reduction and audio compensation, and more particularly to a system, article, and method regulating the volume and frequency content of audio output devices based on the interference present in their aural surroundings.

2. Description of the Related Art

Current methods and systems that compensate for noise interference and act to enhance mobile sound producing device use include noise canceling headphones that are a passive means of reducing the interfering noise surrounding. In addition, cell phones, PDAs, and beepers may have primitive functions that enable the user to manually reduce noise interference. These devices may have different volume settings, which allow users to raise the volume manually when they are in a noisy setting.

SUMMARY OF THE INVENTION

Embodiments of the present invention include a system, method, and article for regulating the volume and frequency content of audio producing devices, the system includes: one or more noise making objects (NMO) configured with individual sound control devices in electrical communication with a noise management server and one or more audio producing devices configured with individual sound control devices; wherein the sound control devices have electronic logic processing, storage, and communication capabilities; wherein the noise management server utilize the sound control devices to: determine whether the one or more NMO are producing noise in the audible range of one or more audio producing devices; determine the noise characteristic of the one or more NMO; command the one or more NMO to send the noise characteristic to the one or more audio producing devices; and wherein the volume and frequency content of audio produced by the one or more audio producing devices is adjusted in response to the received noise characteristic.

A method for regulating the volume and frequency content of audio output, the method includes: determining whether a NMO is producing noise in the audible range of an audio producing device; determining the noise characteristic of the NMO; sending the noise characteristic to the audio producing device; and adjusting the volume and frequency content of audio output by the audio producing device in response to the received noise characteristic.

An article comprising one or more computer-readable storage media containing instructions that when executed by a computer enables regulation of the volume and frequency content of audio output; wherein the method further includes: determining whether a NMO is producing noise in the audible range of an audio producing device; determining the noise characteristic of the NMO; sending the noise characteristic to the audio producing device; and adjusting the volume and frequency content of audio output by the audio producing device in response to the received noise characteristic.

TECHNICAL EFFECTS

As a result of the summarized invention, a solution is technically achieved for a method, article, and system for regulating the volume and frequency content of audio output devices based on the interference present in their aural surroundings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1A:
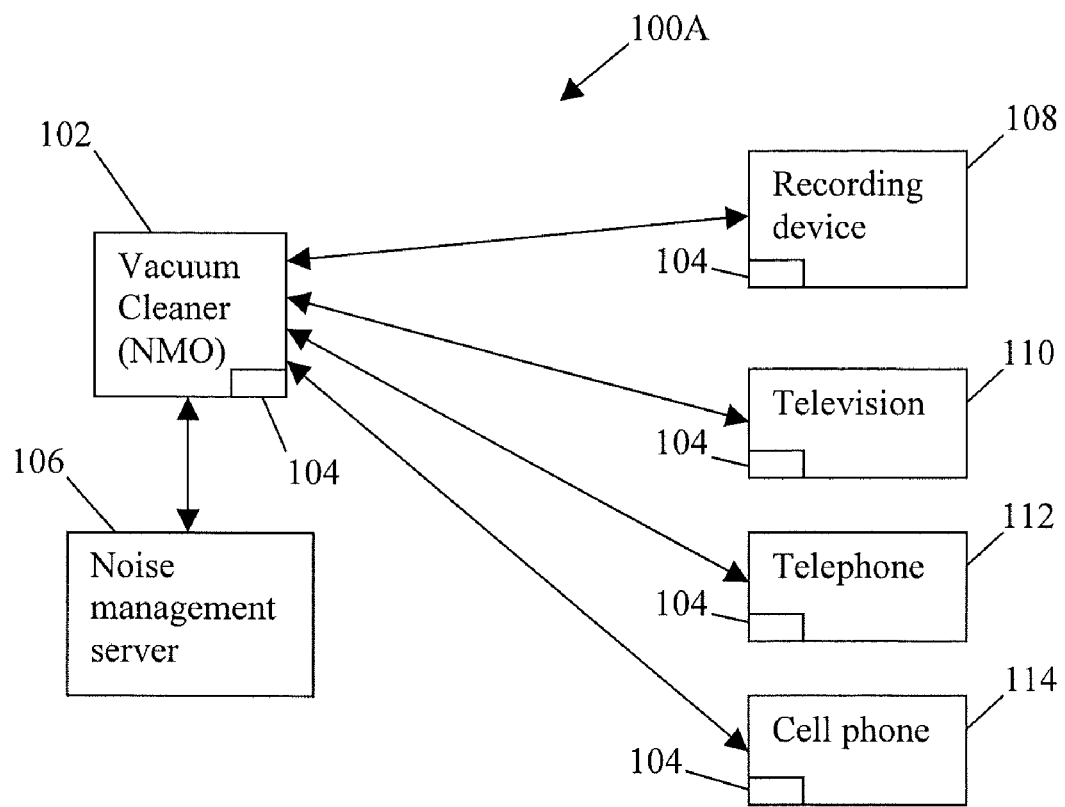
FIGS. 1A and 1B are block diagrams of exemplary systems of embodiments of the invention.

The detailed description explains the preferred embodiments of the invention, together with advantages and features, by way of example with reference to the drawings.

DETAILED DESCRIPTION

The current methods and systems that compensate for noise interference and act to enhance mobile sound producing device use are limited and not always useful. Noise canceling headphones are a passive means for compensating for the noise interference surrounding a user during mobile music device use. However, noise canceling headphones are not useful for other mobile devices such as cell phones and other devices that are expected to be used without headphones. In addition, noise canceling headphones only reduce interference noise to a certain extent, reducing but not minimizing the level of noise interference. Cell phones, PDAs, and beepers may have primitive functions that enable the user to vary volume settings, which allow the user to raise the volume manually, to reduce noise interference when they are in a noisy setting. However, this manual volume adjustment function is not always efficient and can often be a cumbersome due to the requirement of manual adjustment of the volume levels. Therefore, there is a need for a system and method that automatically modulates the volume of mobile devices to minimize noise interference from a user's surroundings.

Embodiments of the invention provide a system and method for regulating the volume and frequency content of audio output devices based on the interference present in their aural surroundings. The invention maximizes the ability for people to use mobile devices like cellular phones, portable music players, and other devices that transmit auditory signals to alert, entertain, or inform the user. The system relies on a central server that transmits and receives signals from mobile devices and other noise-making objects (NMO) in a given area.

An example application of embodiments of the invention includes a cell phone user who may fail to hear their phone's alert when walking past a lawnmower or other NMO. In this example situation the lawnmower or NMO sends a signal to a server or user's mobile device to temporarily increase the volume on the phone until the noise no longer interferes with the user's ability to hear their phone's alert. When the NMO is no longer in the immediate aural surroundings of the user, or ceases operation, the server or mobile device reduces the volume back to its original level. The same set of actions can be applied to many scenarios with various mobile devices (PDAs, MP3 players, CD players, cameras, beepers, etc.) and NMOs (cars, trucks, household appliances such as vacuum cleaners, helicopters, stereos, etc.) Embodiments of the invention may also be applied to non-cellular or non-mobile sound devices, such as a home TV adapting its audio output when an airplane is flying above a house, or a car radio adapting its volume to a passing vehicle. The user has the ability to configure the device using a training module that adjusts the volume levels according to his or her preferred aural abilities.

In addition to audio volume level adjustments, embodiments of the invention may make other kinds of changes in device output sound to adapt to conditions in the aural surroundings, such as modifying sounds themselves in certain frequency bands to mask noise more efficiently. Embodiments of the invention may also be applied to recording devices used in noisy environments. Recordings made in noisy environments may have their audio characteristics adjusted accordingly to mask noise. Embodiments of the invention employ a noise manager to determine the effect of noise on sound production quality and to reduce interference of noise with the audio generated by the sound generating device.

Embodiments of the invention offer improved noise cancellation through the identification of the noise source (NMO). Noise cancellation techniques are inherently less accurate when the noise cancellation system itself is required to evaluate the source of the noise (e.g., music, speech, appliances, automobiles). In order to more efficiently cancel different kinds of noises there is a need to define their type. In addition, during the time required for conventional noise cancellation devices to evaluate the source of the noise, users may be exposed to loud or bothersome sounds before a response by the noise cancellation device is implemented. In embodiments of the invention, the NMO in the system that generates the noise sends a signal in advance to the noise cancellation device on what kind of noise it generates. The noise cancellation device, of embodiments of the invention, may then immediately choose specific noise cancellation models to reduce expected noise based on the signal received from the NMO. By sending information about expected noise type in advance, the NMO helps to prevent undesirable noise effects.

The noise cancellation devices of the present invention utilize radio signals traveling at the speed of light, which are approximately 240 times greater than the speed of sound. The large differential between the speeds of light and sound provide a relatively large anticipation interval for the noise cancellation of sounds originating from NMOs that are at a great distance from the noise cancellation devices of embodiments of the invention. The anticipation interval affect is especially pronounced for NMOs such as airplanes. Embodiments of the invention may include noise cancellation devices in homes that are within the flight paths of nearby airports that utilize radio frequency (RF) signals from airplanes, flying overhead to alter the audio output of sound devices in the home.

Figure 1B:
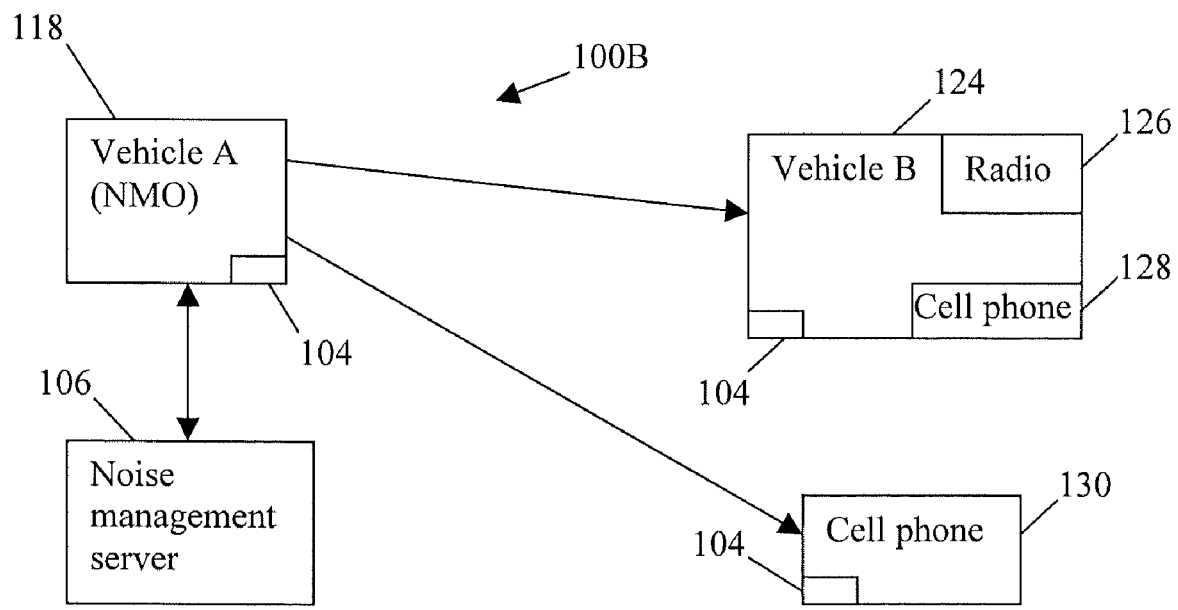

FIGS. 1A and 1B are block diagrams of exemplary systems of embodiments of the invention. System 100A of FIG. 1A is an example embodiment of a NMO in the form of a vacuum cleaner 102 that is equipped with a sound control device 104. The sound control device 104 has electronic logic processing, storage, and communication capabilities. The sound control device 104 may also have position determination devices. The position determination devices may utilize global positioning satellites (GPS) or proximity sensors. The NMO's 102 sound control device 104 communicates with a noise management server 106, and audio producing devices (108, 110, 112, 114), including but not limited to recording devices 108, televisions 110, telephones 112, and cell phones 116. The audio producing devices (108, 110, 112, 114) are also equipped with sound control devices 104 to facilitate communication, command and control with the NMO 102.

The noise management server 106 determines the proximity of the NMO 102 to the audio producing devices (108, 110, 112, 114) based on positional information from the sound control devices 104. If the noise management server 106 determines the NMO 102 is sufficiently close to produce noise interference with the audio producing devices (108, 110, 112, 114), the noise management server 106 commands the NMO 102 to signal the audio producing devices (108, 110, 112, 114) to increase their volume or alter their audio spectral content while the NMO 102 is in a given distance. The noise management server 106 determines the effect of the noise from the NMO 102 on the sound quality of the audio producing devices (108, 110, 112, 114), and acts to reduce the interference between the NMO 102 and audio producing devices (108, 110, 112, 114). In embodiments of the invention the noise management server may be integrated with the sound control device 104 on the NMO 102, or separated so as to communicate with additional NMO 102. Alternative methods for noise reduction and compensation include but are not limited to those described in U.S. Pat. No. 3,700,812 entitled "Audio System with means for Reducing Noise Effects", U.S. Pat. No. 6,438,513 entitled "Process for Searching for a Noise Model in Noisy Audio Signals", and U.S. Pat. No. 7,254,536 entitled "Method of Noise Reduction using Correction and Scaling Vectors with Partitioning of the Acoustic Space in the Domain of Noisy Speech" that are hereby incorporated by reference herein. There is constant interaction between the NMO 102 and the noise management server 106.

System 100B of FIG. 1B is an example embodiment of a NMO in the form of a vehicle A 118 that is equipped with a sound control device 104 that is in the vicinity of a second vehicle B 124. Vehicle B 124 is also equipped with a sound control device 104 for use with an on board radio 126 and the driver's cell phone 128. In addition, a pedestrian with a cell phone 130 is also part of this exemplary system 100B. As in the case of system 100A of FIG. 1, noise management server 122 determines the proximity of the NMO Vehicle A 118 to the audio producing devices (126 and 128) in vehicle B 124 and pedestrian cell phone 130 based on positional information from the sound control devices 104. In addition, the relative velocity (speed and direction) of the NMO Vehicle A 118 may also be tracked. If the noise management server 106 determines the NMO 118 is sufficiently close to produce noise interference with the audio producing devices (126, 128, 130), the noise management server 106 commands the NMO 118 to signal the audio producing devices (126, 128, 130) to increase their volume or alter their audio spectral content while the NMO 118 is in a given distance. The noise management server 106 determines the effect of the noise from the NMO 118 on the sound quality of the audio producing devices (126, 128, 130), and acts to reduce the interference between the NMO 118 and audio producing devices (126, 128, 130).

The radio 126 contains an auditory profile of the acoustic environment within vehicle B 124. The acoustic environment includes, for example, the volume of the voices of passengers, the sound volume of wind if vehicle B has windows that are open or closed, the sounds of moving parts within the car, etc. When the radio 126 receives a location and characteristic noise signal from an approaching vehicle A 118, the radio 126 may calculate the volume and frequency adjustments required to maintain consistent audio quality. The driver's cell phone 128 employs additional features of sound control device 104 to maintain sound quality not only for the user, but also for the individual who is calling the cell phone 128. The cell phone 128 has its volume and sound quality adjusted accordingly to the acoustic environment. In addition, sound is modified and delivered to the user on the receiving end of the phone such that interference from the driver's environment is removed and the sound quality is maintained.

Figure 2A:
FIGS. 2A and 2B are example embodiments of the invention involving hearing aid devices.
Figure 2B:

FIGS. 2A and 2B are example embodiments of the invention involving hearing aid devices 202. In FIG. 2A, when vacuum cleaner 200 approaches hearing aid device 202, a noise characteristic signal is sent to the hearing aid device 202, indicating the location and character of the noise from the vacuum cleaner. Hearing aid device 202 contains an auditory profile of its surroundings. For example, the hearing aid device 202 may differentiate between sounds in a large room versus sounds in small room. Sounds in a small room are received at relatively equal volume throughout the room as compared to a large room, where different points in the room receive different volume levels from a single sound source. The hearing aid device 202 may calculate the acoustic impact of the noise of the vacuum cleaner 200 or other NMO based on the location of the vacuum cleaner (NMO) 200 and the noise characteristic data that the vacuum cleaner 200 sends to the hearing aid device 202. Using the information provided by the vacuum cleaner (NMO) 200, the hearing aid device modulates the amplitude and frequency of the sound it emits to compensate for any interference caused by the vacuum cleaner (NMO) 200.

FIG. 2B emphasizes the link between the hearing aid device 202 and a sound adjusting service 204. The sound adjusting service 204 may be remote, and serves to modify the sound emitted by the hearing aid device 202 according to the characteristic noise signal of the environment surrounding the hearing aid device 202. The sound adjusting service 204 may modify the audio emitted by the hearing aid device 202 via two methods. In the first method, the sound adjusting service 204 sends an exact algorithm of how the audio characteristics are changed within the hearing aid device 202. In the second method, the sound adjusting service 204 modifies the sound to be emitted by the hearing aid device 202, and sends a digital recording of the audio to be emitted by the hearing device. The audio that the sound adjusting service 204 sends to the hearing device is integrated with the sounds emitted by the hearing aid device 202.

Figure 3:
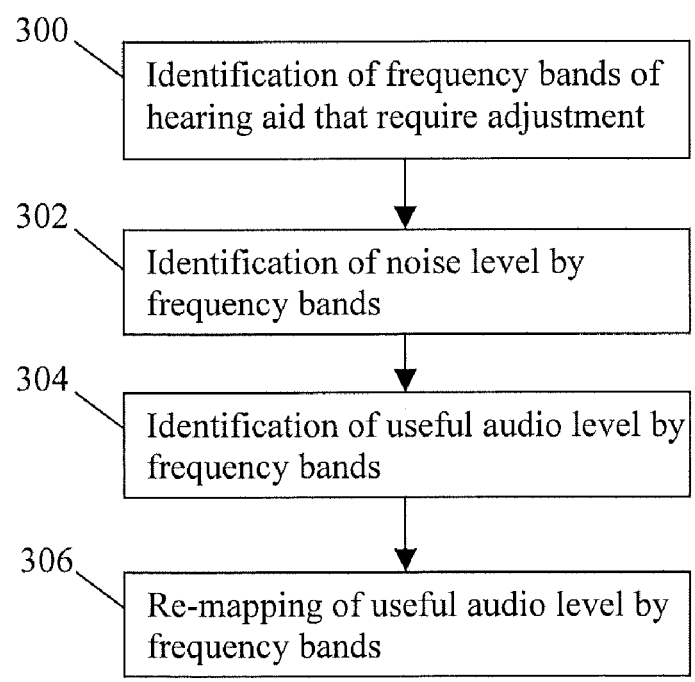
FIG. 3 is a block diagram of an exemplary method for how an adjusting service illustrated in FIG. 2B creates an algorithm to send to the hearing aid device according to embodiments of the invention.

FIG. 3 is a block diagram of an exemplary method for how the adjusting service 204 of FIG. 2B creates an algorithm to send to the hearing aid device 202. In the method, audio frequency bands received by the user that require adjustment are identified (block 300). The audio characteristics (noise level) of the individual sound frequency bands are identified (block 302). The necessary audio quality (audio level) for the given sound (frequency band is identified (Block 304). The data that characterizes the necessary audio quality is used to re-map the audio quality of the existing sound (306).

Figure 4:
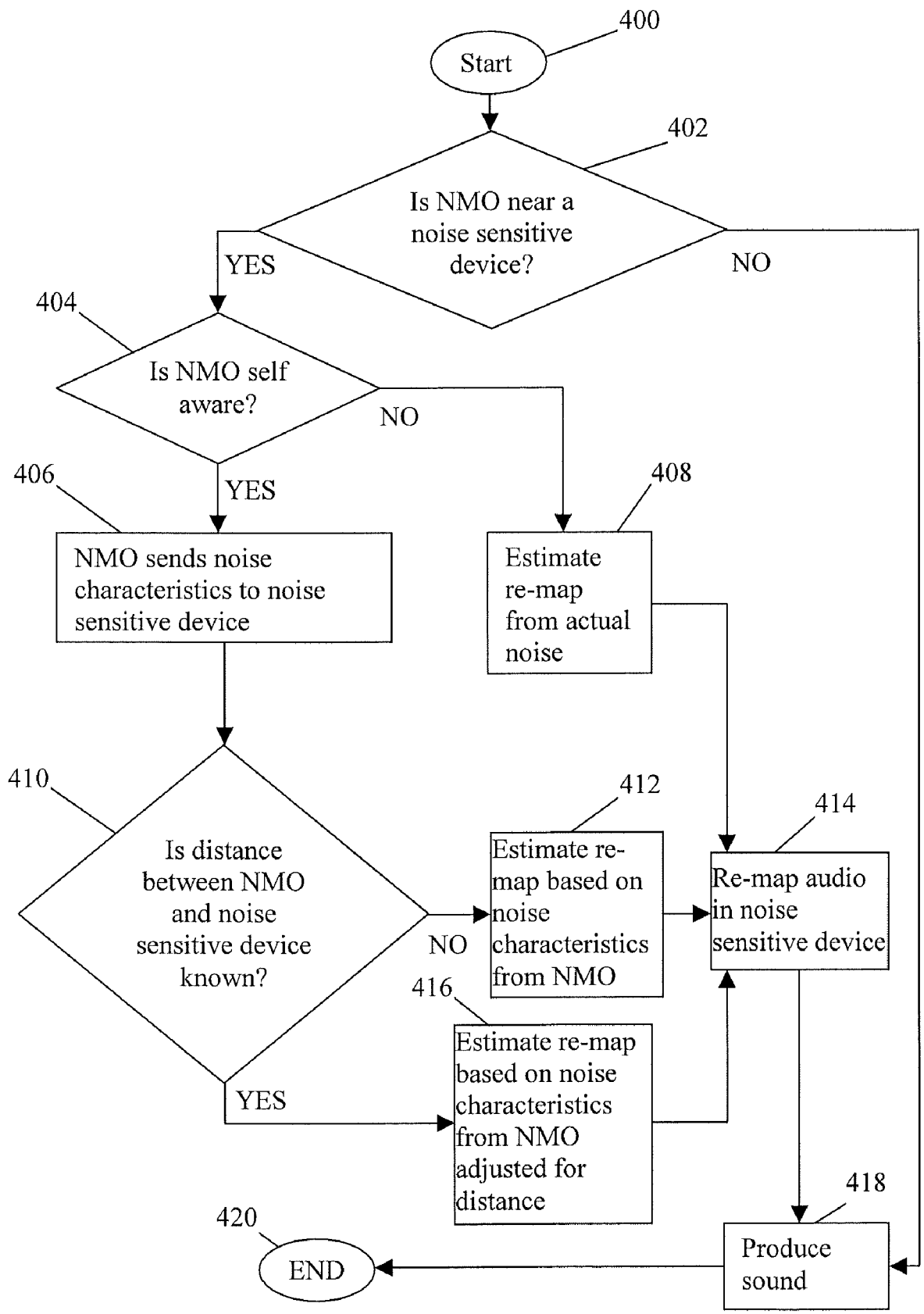
FIG. 4 illustrates a flowchart for implementing embodiments of the invention.

FIG. 4 illustrates a flowchart for implementing embodiments of the invention. The process starts (block 400) with a determination of whether a NMO is producing noise near (audible range) a noise sensitive device (decision block 402). If there are no NMO near the noise sensitive device (decision block 402 is NO) and the sound is produced by the noise sensitive device unaltered (block 418). However, if there is an NMO near a noise sensitive device (decision block 402 is YES) and the NMO is aware of its noise characteristics (decision block 404 is Yes), the NMO sends noise characteristics to the noise sensitive device (block 406). If the distance between the NMO and the noise sensitive device is known (decision block 410 is YES), an estimated re-map is based on noise characteristics from the NMO that is also adjusted for the distance between them (block 416). A re-map of the audio in the noise sensitive device is made (block 414), and sound is produced (block 418) and the process ends (block 420). If the distance between the NMO and the noise sensitive device is not known (decision block 410 is NO), an estimated re-map is based on noise characteristics from the NMO alone (block 412). If the NMO is not aware of its noise characteristics (decision block 404 is NO), the re-mapping algorithm is estimated from the actual noise from the NMO (block 408), and the audio in the noise sensitive device is re-mapped (block 414). After the audio is re-mapped, the noise sensitive device reproduces the sound (block 418) and the process ends (block 420).

The data exchange system of the present invention may reside on a stand-alone computer system, which may have access to the Internet, or may reside on a computer system, which is part of the network through which there is Internet access. With a connection to a network and/or the Internet, there are several different ways in which the process software used to implement the systems and methods of the present invention may be integrated with the network, and deployed using a local network, a remote network, an e-mail system, and/or a virtual private network. The following descriptions review the various ways of accomplishing these activities.

Integration of Data Exchange System Software.

To implement the data exchange systems and methods of the present invention, process software, which is composed of the software as described above and related components including any needed data structures, is written and then if desired, integrated into a client, server, and network environment. Taking those steps needed to enable the process software to coexist with other application, operating system and network operating system software and then installing the process software on the clients and servers in the environment where the process software will function accomplish this integration. An overview of this integration activity will now be provided, followed by a more detailed description of the same with reference to the flowchart of FIG. 5.

The first step in the integration activity is to identify any software on the clients and servers where the process software will be deployed that are required by the process software or that need to work in conjunction with the process software. This includes the network operating system, which is the software that enhances a basic operating system by adding networking features.

Next, the software applications and version numbers are identified and compared to the list of software applications and version numbers that have been tested to work with the process software. Those software applications that are missing or that do not match the correct version are upgraded with the correct version numbers. Program instructions that pass parameters from the process software to the software applications will be checked to ensure the parameter lists match the parameter lists required by the process software. Conversely, parameters passed by the software applications to the process software will be checked to ensure the parameters match the parameters required by the process software. The client and server operating systems including the network operating systems are identified and compared to the list of operating systems, version numbers, and network software that have been tested to work with the process software. Those operating systems, version numbers, and network software that do not match the list of tested operating systems and version numbers are then upgraded on the clients and servers to the required level.

After ensuring that the software resident on the computer systems where the process software is to be deployed is at the correct version level(s), that is, has been tested to work with the process software, the integration is completed. Installing the process software on the clients and servers does this. Armed with the foregoing overview of the integration activity, the following detailed description of the same should be readily understood.

Figure 5:
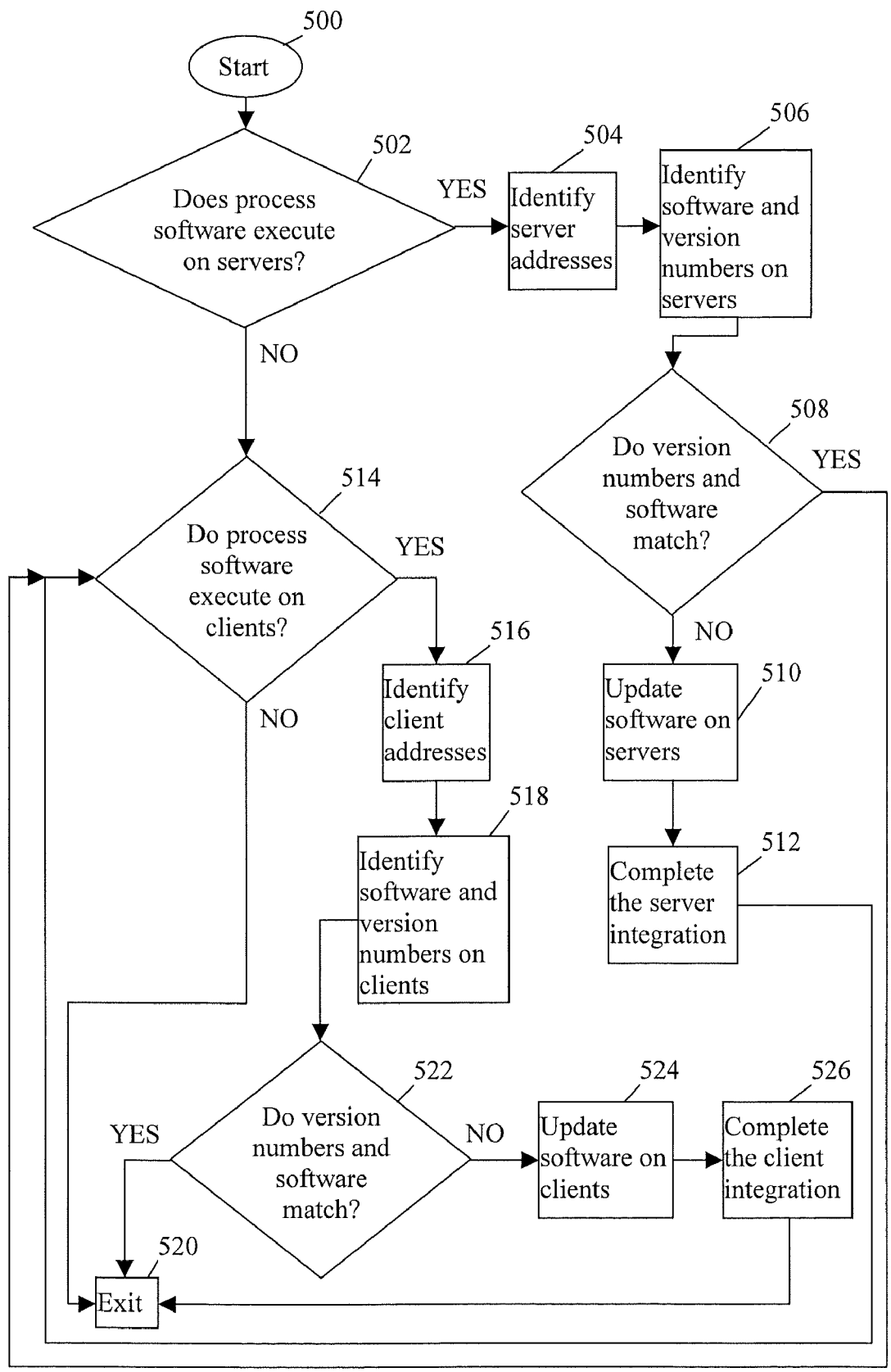
FIG. 5 is a flowchart illustrating how the process software implementing the systems and methods of the invention may be integrated into client, server, and network environments.

Referring to FIG. 5, step 500 begins the integration of the process software for implementing the search and reference systems and methods of the present invention. It is determined whether there are any process software programs that will execute on a server or servers at step 502. If this is not the case, then integration proceeds to determine if the process software will execute on clients at step 514. If there are process software programs that will execute on a server(s), then the server addresses are identified at step 504. The servers are checked to see if they contain software that includes the operating system (OS), applications, and network operating systems (NOS), together with their version numbers, that have been tested with the process software at step 506. The servers are also checked to determine if there is any missing software that is required by the process software as part of the activity at step 506. A determination is made whether the version numbers match the version numbers of OS, applications and NOS that have been tested with the process software at step 508. If all of the versions match, and there is no missing required software, the integration continues at step 514. If one or more of the version numbers do not match, then the unmatched versions are updated on the server or servers with the correct versions at step 510. Additionally, if there is missing required software, then it is updated on the server or servers at step 510. Installing the process software at step 512 completes the server integration.

Step 514, which follows either step 502, 508 or 512, determines if there are any programs of the process software that will execute on the clients. If no process software programs execute on the clients, the integration proceeds to step 520 and exits. If there are process software programs that will execute on clients, the client addresses are identified at step 516.

At step 518, the clients are checked to see if they contain software that includes the operating system (OS), applications, and network operating systems (NOS) software, together with their version numbers, that have been tested with the process software. The clients are also checked at step 518 to determine if there is any missing software that is required by the process software.

At step 522, a determination is made if the version numbers match the version numbers of OS, applications and NOS that have been tested with the process software. If all of the versions match, and there is no missing required software, then the integration proceeds to step 520 and exits.

If one or more of the version numbers do not match, then the unmatched versions are updated on the clients with the correct versions at step 524. In addition, if there is missing required software, then it is updated on the clients as part of step 524. Installing the process software on the clients at step 526 completes the client integration. The integration proceeds to step 520 and exits.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiments to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A system for regulating the volume and frequency content of audio producing devices, the system comprising:
one or more noise making objects (NMO) configured with individual sound control devices in electrical communication with a noise management server and one or more audio producing devices configured with individual sound control devices;
wherein the sound control devices have electronic logic processing, storage, and communication capabilities;
wherein the noise management server utilize the sound control devices to:
determine whether the one or more NMO are producing noise in the audible range of one or more audio producing devices;
determine a noise characteristic of the one or more NMO;
command the one or more NMO to send the noise characteristic to the one or more audio producing devices; and
wherein the volume and frequency content of audio produced by the one or more audio producing devices is adjusted in response to the received noise characteristic.

2. The system of claim 1, wherein the sound control devices have position determination devices.

3. The system of claim 2, wherein the position determination devices utilize global positioning satellites.

4. The system of claim 2, wherein the position determination devices utilize proximity sensors.

5. The system of claim 2, wherein the noise management server utilizes the sound control devices to determine the distances between the one or more NMO and the one or more audio producing devices; and
wherein the adjustment to the volume and frequency content of the one or more audio producing devices is based on the received noise characteristics and the determined distance.

6. The system of claim 1, wherein the noise management server is integrated with the sound control device on a NMO.

7. The system of claim 1, wherein the adjustment of volume and frequency content of the audio further comprises:
adjusting the volume in certain frequency bands.

8. A method for regulating the volume and frequency content of audio output by an audio producing device with a noise management server, the method comprising:
- receiving a noise characteristic of a noise making objects (NMO) from a first individual sound control device of the NMO;
- determining whether the NMO is producing noise in the audible range of the audio producing device;
- sending the noise characteristic to a second individual sound control device of the audio producing device; and
- adjusting the volume and frequency content of audio output by the audio producing device in response to the received noise characteristic;
- wherein the first and second individual sound control devices are in electrical communication with the noise management server.

9. The method of claim 8, wherein adjusting the volume and frequency content of the audio further comprises:
- adjusting the volume in certain frequency bands.

10. The method of claim 8, further comprising:
- determining the distance between the NMO and the audio producing device; and
- wherein the adjustment to the volume and frequency content of the audio producing device is based on the received noise characteristics and the determined distance.

11. The method of claim 10, wherein the distance determination is based on GPS data.

12. The method of claim 10, wherein the distance determination is based on proximity sensors.

13. The method of claim 8, further comprising integrating process software for implementing the regulating of the volume and frequency content of audio output, the integrating comprising:
- determining if the process software will execute on at least one server;
- identifying an address of the at least one server;
- checking the at least one server for operating systems, applications, and version numbers for validation with the process software, and identifying any missing software applications for the at least one server that are required for integration;
- updating the at least one server with respect to any operating system and application that is not validated for the process software, and providing any of the missing software applications for the at least one server required for the integration;
- identifying client addresses and checking client computers for operating systems, applications, and version numbers for validation with the process software, and identifying any software applications missing from the client computers that are required for integration; updating the client computers with respect to any operating system and application that is not validated for the process software, and providing any missing software application for the client computers required for the integration; and
- installing the process software on the client computers and the at least one server.

14. An article comprising one or more computer-readable storage media containing instructions that when executed by a computer enables regulation of the volume and frequency content of audio output by an audio producing device with a noise management server; wherein the method further comprises:
- receiving a noise characteristic of a noise making objects (NMO) from a first individual sound control device of the NMO;
- determining whether the NMO is producing noise in the audible range of the audio producing device;
- sending the noise characteristic to a second individual sound control device of the audio producing device; and
- adjusting the volume and frequency content of audio output by the audio producing device in response to the received noise characteristic;
- wherein the first and second individual sound control devices are in electrical communication with the noise management server.

15. The article of claim 14, wherein adjusting the volume and frequency content of the audio further comprises:
- adjusting the volume in certain frequency bands.

16. The article of claim 14, wherein the method further comprises:
- determining the distance between the NMO and the audio producing device; and
- wherein the adjustment to the volume and frequency content of the audio producing device is based on the received noise characteristics and the determined distance.

17. The article of claim 16, wherein the distance determination is based on GPS data.

18. The article of claim 16, wherein the distance determination is based on proximity sensors.

* * * * *